(12) United States Patent
Hung et al.

(10) Patent No.: US 12,119,831 B2
(45) Date of Patent: Oct. 15, 2024

(54) ULTRA-LOW POWER INSTANT LOCK PHASE LOCK LOOP (PLL)

(71) Applicant: Maxim Integrated Products, Inc., San Jose, CA (US)

(72) Inventors: Cheng-Hsien Hung, Allen, TX (US); Chun-Wei Hsu, Plano, TX (US); ChunCheng Chou, Frisco, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 18/113,601

(22) Filed: Feb. 23, 2023

(65) Prior Publication Data

US 2023/0327676 A1 Oct. 12, 2023

Related U.S. Application Data

(60) Provisional application No. 63/328,358, filed on Apr. 7, 2022.

(51) Int. Cl.
*H03L 7/099* (2006.01)
*H03L 7/093* (2006.01)

(52) U.S. Cl.
CPC ............ *H03L 7/0992* (2013.01); *H03L 7/093* (2013.01); *H03L 2207/50* (2013.01)

(58) Field of Classification Search
CPC .... H03L 7/0992; H03L 7/093; H03L 2207/50
See application file for complete search history.

(56) References Cited

U.S. PATENT DOCUMENTS

| | | | | |
|---|---|---|---|---|
| 5,572,157 A * | 11/1996 | Takashi | .................. | H03L 7/093 327/156 |
| 9,225,348 B2 * | 12/2015 | Ainspan | ................ | H03L 7/1974 |
| 10,895,850 B1 * | 1/2021 | Elkholy | ................ | G04F 10/005 |
| 11,005,480 B1 * | 5/2021 | Yang | ...................... | H03L 7/099 |
| 11,456,750 B2 * | 9/2022 | Lin | ........................ | H03L 7/1976 |
| 11,513,135 B2 * | 11/2022 | Marx | ..................... | G01P 3/4802 |
| 11,990,918 B2 * | 5/2024 | Guo | ....................... | H03M 1/825 |
| 2010/0134335 A1 * | 6/2010 | Park | ....................... | G04F 10/06 341/118 |

(Continued)

FOREIGN PATENT DOCUMENTS

| | | | | |
|---|---|---|---|---|
| CN | 112005128 A | * | 11/2020 | ............. G01S 17/14 |
| CN | 116896375 A | * | 10/2023 | ............. H03L 7/085 |

(Continued)

*Primary Examiner* — Adam D Houston
(74) *Attorney, Agent, or Firm* — North Weber & Baugh; Michael North

(57) ABSTRACT

Systems and methods reduce a locking time of a type-II all-digital phase-locked loop (ADPLL) circuit by performing steps that comprise receiving a reference signal having a reference frequency and setting a digitally controlled oscillator (DCO) to a target frequency greater than the reference frequency. The DCO generates an output signal that is used to generate a feedback signal. A time-to-digital converter is used to determine an initial phase difference between the reference signal and the feedback signal, and a digital initial phase compensation circuit adjusts the initial phase difference to a substantially zero phase difference to reduce the locking time of the ADPLL circuit such that the ADPLL circuit reaches a steady-state condition in ten or fewer cycles of the reference signal.

18 Claims, 4 Drawing Sheets

(56) References Cited

U.S. PATENT DOCUMENTS

| | | | |
|---|---|---|---|
| 2015/0145571 A1* | 5/2015 | Perrott | G04F 10/005 |
| | | | 327/551 |
| 2017/0093412 A1* | 3/2017 | Van Brunt | H03L 7/093 |
| 2020/0235746 A1* | 7/2020 | Candler | H03L 7/099 |
| 2020/0295765 A1* | 9/2020 | Agrawal | H03L 7/083 |
| 2021/0255661 A1* | 8/2021 | Fredenburg | G01R 23/10 |
| 2022/0094385 A1* | 3/2022 | Degani | H03L 7/16 |
| 2023/0318609 A1* | 10/2023 | Srinivasan | H03L 1/022 |
| 2023/0327676 A1* | 10/2023 | Hung | H03L 7/093 |
| | | | 327/156 |

FOREIGN PATENT DOCUMENTS

| | | | | |
|---|---|---|---|---|
| EP | 3407496 A1 * | 11/2018 | | A61P 35/00 |
| WO | WO-2015047280 A1 * | 4/2015 | | G04F 10/005 |

* cited by examiner

ULTRA-LOW POWER INSTANT LOCK PHASE LOCK LOOP (PLL)

CROSS REFERENCE TO RELATED PATENT APPLICATIONS

The present application claims priority benefit, under 35 U.S.C. § 119(e), to commonly-assigned U.S. provisional patent application No. 63/328,358, filed on Apr. 7, 2022, entitled "ULTRA-LOW POWER INSTANT LOCK PHASE LOCK LOOP (PLL)", listing as inventors Cheng-Hsien Hung, Chun-Wei Hsu, and ChunCheng Chou, which application is herein incorporated by reference as to its entire content. Each reference mentioned in this patent document is incorporated by reference herein in its entirety.

BACKGROUND

A. Technical Field

The present disclosure relates generally to electrical circuits. More particularly, the present disclosure relates to systems and methods for improving performance parameters in electrical circuits comprising PLLs.

B. Background

PLLs are widely used in applications such as RF demodulators, spectrum analyzers, and frequency synthesizers. Phase and frequency locking by using a PLL advantageously reduces switching times, e.g., when transitioning between from a transmission mode to a receiving mode and vice versa. Ultimately, this aids in increasing data throughput and lowers power consumption of electric circuits. While operating at low bandwidths aids in suppressing unwanted noise typically caused by a Voltage Control Oscillator (VCO), low-bandwidth PLLs have inherently higher locking or settling times. Accordingly, circuit designers are oftentimes faced with a trade-off between bandwidth requirements and other performance metrics. Therefore, it would be desirable overcome these limitations by providing systems and methods that allow designers to optimize key design metrics in electric circuits utilizing PLLs, while achieving a rapid lock and good phase noise performance, ideally, at low power and without scarifying bandwidth.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not drawn to scale.

FIG. 1 is a simplified block diagram of a traditional analog type-II PLL.

DETAILED DESCRIPTION OF EMBODIMENTS

Figure 1:
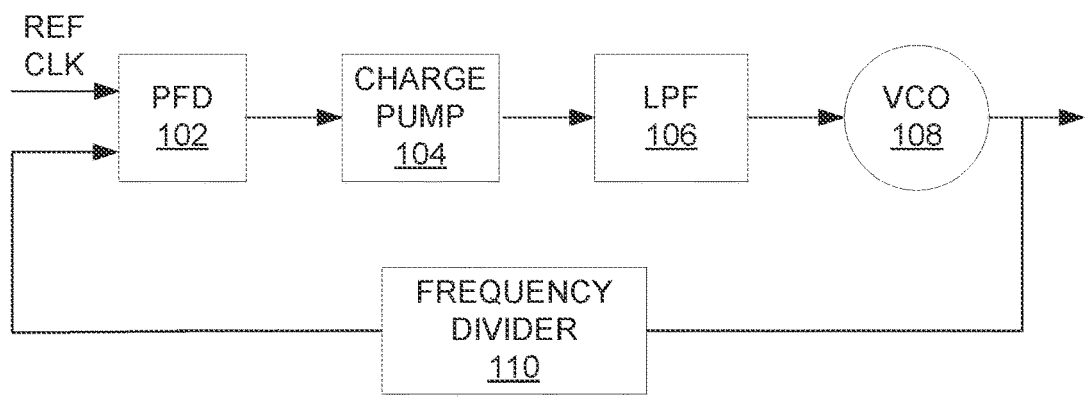
FIG. 1 is a simplified circuit diagram of an exemplary system implementation in a broadband optical communications link, according to various embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

It is noted that embodiments described herein are given in the context of differential broadband high-frequency amplifiers, but one skilled in the art will recognize that the teachings of the present disclosure are not limited to the applications and may equally be used in other contexts.

In this document, the terms "block" and "building block" refer to any circuit component and combination of circuit components that form a sub-circuit.

FIG. 1 is a simplified block diagram for a traditional analog type II-PLL circuit. PLL circuit 100 comprises PFD 102 that generates an error signal, charge pump 104 that amplifies the error signal generated by PFD 102, loop filter (LPF) 106, VCO 108, and frequency divider circuit 110. The output of VCO 108 is fed back, via a feedback control loop, to the input of PFD 102. At its input, PFD 102 further receives a reference clock signal, denoted as REF CLK.

Although PLL circuit 100 in FIG. 1 cannot directly control the phase of VCO 108, circuit 100 can adjust the phase of VCO 108, e.g., by adjusting frequency, until frequency and phase lock are achieved. Therefore, in operation, PFD 102 converges to a 0-degree phase relationship between the reference clock signal and VCO 108 by adjusting the frequency of VCO 108 to keep the phases matched.

Like other analog type-II PLLs, PLL circuit 100 has a detector configuration that outputs a signal that is proportional to the phase difference between the two input signals if the input signals have the same frequency. The locking time of PLL circuit 100 typically is inversely proportional to the loop bandwidth. A low loop bandwidth advantageously suppresses noise caused by the reference clock and circuit components other than VCO 108. However, this noise reduction comes at the cost of significantly prolonged locking time, which negatively impacts the length of time intervals between data packages, or the time between receiving and transmitting data packages. Shorter locking times and shorter time intervals between data packages are desirable, however, to increase the effective data rate of a communication system.

Therefore, it is highly desirable to have PLL circuit solutions that facilitate rapid lock. Various embodiments herein utilize a "one-shot" or instant lock mechanism, i.e., a lock scheme that, advantageously, results in a near zero settling-time.

Figure 2:
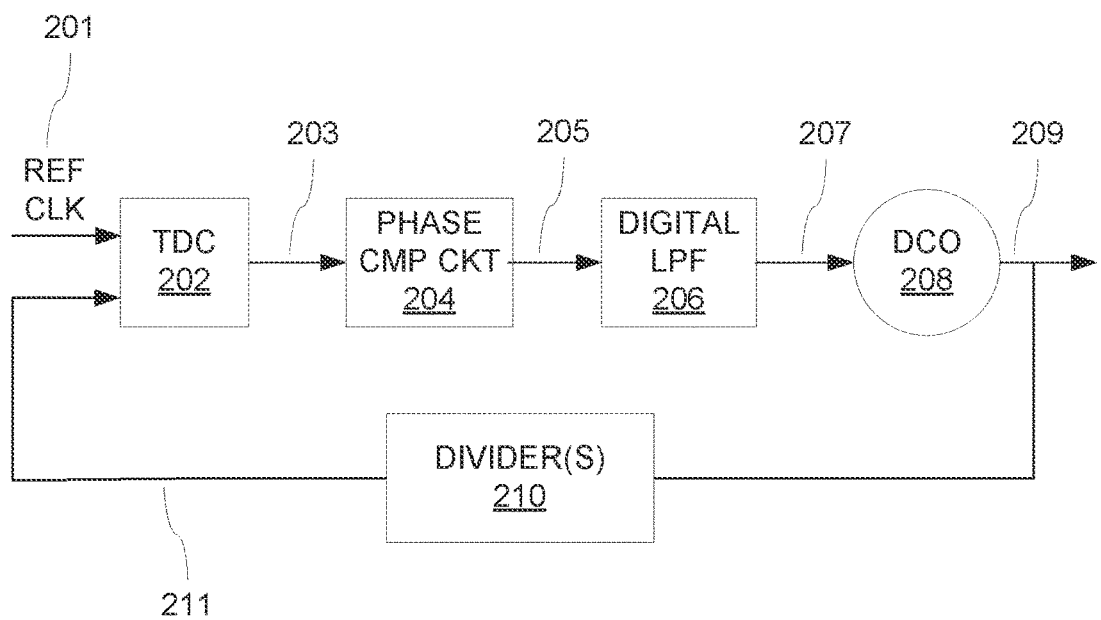
FIG. 2 illustrates a simplified block diagram for an all-digital phase-locked loop (ADPLL) circuit according to various embodiments of the present disclosure.

FIG. 2 illustrates a simplified block diagram for an ADPLL circuit according to various embodiments of the present disclosure. As depicted, ADPLL circuit 200 comprises two input signals, reference clock signal 201 and feedback signal 211. Circuit 200 further comprises TDC 202, digital phase compensation circuit 204, digital LPF 206, digitally controlled oscillator (DCO) 208, and frequency divider circuit 210.

In operation, TDC 202 may serve as a PFD that detects a departure of the phase of DCO 208 from the phase of reference clock signal 201, e.g., by quantizing a relative time difference in rising edges of the two input signals 201 and 211. Based on this relative time difference that, by definition, is greater than zero, TDC 202 produces a non-negative error signal 203 that represents the phase difference, or digital phase error, between input signals 201, 211. In embodiments, digital LPF 206 is implemented as a low-pass filter that attenuates high-frequency and phase noise contained in error signal 203 and brings DCO 208 into the frequency and phase lock by adjusting the phase of phase-compensated signal 205 to be locked to the phase of reference clock signal 201. Digital LPF 206 may generate control signal 207 (e.g., a digital code that represents a fractional frequency) that may be used to control the frequency of DCO 208, e.g., by varying a variable clock signal to change the relative time difference (i.e., phase) between the rising edges to reduce any detected phase difference until a steady-state (lock condition) is achieved, which causes the frequency of DCO 208 to match that of reference clock 201.

In embodiments, DCO 208 may be implemented as a variable phase device that uses a free-running crystal oscillator to generate that variable clock signal, e.g., by using an LC-tank circuit that comprises one or more digitally-controlled varactors. The variable clock signal may be down-divided by divider circuit 210 and fed back into TDC 202, which, in embodiments, compares the phase of clock signal 209 to the reference phase of reference clock signal 201 (which typically operates at a lower frequency than DCO 208) to generate a digital word that represents digital phase error 203.

It is noted that although ADPLL circuit 200 in FIG. 2 is depicted as a digital circuit that comprises exclusively low-footprint and low-power digital components, it is understood that ADPLL circuit 200 may comprise any number of analog components. It is further understood that instant locking using various embodiments presented herein may aid in shortening the response time of an entire system that comprises ADPLL circuit 200 in applications other than communication applications. Individual blocks in ADPLL circuit 200 may comprise digital interfaces that may be communicatively coupled to one or more other blocks. For example, a digital interface may be utilized as a control interface that allows for adjusting one or more circuit parameters, such as initial circuit conditions, discussed in greater detail next.

Various embodiments of the present disclosure take advantage of the fact that once initial conditions of some or all individual blocks are known, a near-zero lock time (i.e., instant lock condition) may be achieved for ADPLL circuit 200. In detail, in embodiments, instant lock may be obtained by defining initial circuit conditions for a number of building blocks within the loop. These conditions may be chosen such that the pertinent building blocks can relatively quickly assume their steady-state condition, which greatly aids in reducing the settling time and achieving phase and frequency lock more rapidly than would otherwise be possible. Suitable initial conditions for individual building blocks may cause certain blocks to have settling times that are ten times faster than the rate of a reference clock. As a result, a near-zero settling-time, e.g., within one to five cycles or periods of reference clock 201 may be achieved for each individual building block, for example, each time a set point for ADPLL circuit 200 is changed. It is noted that the bandwidth of reference clock 201 is typically greater than the loop bandwidth, thus, making the reference clock, e.g., ten times faster than the loop itself.

Ideally, to lock phase and frequency in ADPLL circuit 200, lock conditions are set for all building blocks in the loop. For example, to lock the phase, the phase difference between the output of DCO 208 and reference clock 201 should be zero. In practice, however, it is oftentimes difficult to determine exact operating conditions for all building blocks within a circuit. For example, the initial phase difference between the output of DCO 208 and reference clock 201 is typically non-zero. In fact, unlike initial conditions of other digital blocks that may be ascertained, this initial phase difference may be unknown, and a user may have no control over that initial phase.

Therefore, in embodiments, initial conditions for one or more blocks are obtained, e.g., by way of measurement or calibration, while other blocks may be assigned arbitrary, fixed initial conditions. In embodiments, to account for process and environmental variations, calibrations may be employed to ascertain suitable settings that achieve a desired target condition. For example, TDC 202 may measure and record a phase difference between output 211 of divider circuit 210 and the phase of reference clock 201. Phase compensation circuit 204 may then use the measurement results to set the phase difference to an arbitrarily chosen value, preferably, a zero value that may then be provided as input to digital LPF 206, thus, forcing a zero value as the initial condition for digital LPF 206, which an analog circuit such as, for example, the circuit depicted in FIG. 1 is incapable of facilitating.

In embodiments, ADPLL circuit 200 may be implemented according to an architecture that allows lock conditions for all blocks in loop in circuit 200 to be pre-determined. For example, ADPLL circuit 200 may be implemented as a high-order loop that is used to zero out or compensate most loop conditions. For type-II PLL implementations, such as that shown in FIG. 2, the digital LPF 206 input converges to zero once lock is achieved. The phase difference between the phase at the output 209 phase of ADPLL circuit 200 and the phase of reference clock 201 becomes constant when locking. At lock, a zero phase difference is expected at the input of TDC 202, unless there is no offset added by TDC 202 or phase compensation circuit 204.

In embodiments, to quickly settle ADPLL circuit 200, first, the loop frequency may be locked, e.g., by setting DCO 208 to a desired frequency. To account for process and environmental variations, DCO 208 may be calibrated, e.g., in an open loop configuration, to determine a digital code. A proper digital code may be generated, e.g., by using a frequency encoder that effectuates the desired lock frequency for the closed loop within a predetermined accuracy range. It is understood that suitable calibration procedures for one or more blocks in ADPLL circuit 200 may be automatically performed during a power-up phase of ADPLL circuit 200, e.g., to achieve linearity for frequency modulation and improve the linearity of TDC 202.

In embodiments, an initial, unknown, or random phase difference or phase error received, measured, or detected at TDC 202 may be zeroed out, e.g., in the digital domain by phase compensation circuit 204, before it is provided to digital loop filter 206 to, ultimately, zero out the phase error in high-order PLL 200. It is understood that digital phase compensation circuit 204 that obtains the initial phase difference may be integrated into TDC 202 and may be used to measure and encode the initial phase difference, e.g., as an offset, delay, or shift. In embodiments, digital phase compensation circuit 204 may take the initial phase difference at face value, treat it as zero, and lock to that value in a next clock cycle. In other words, digital phase compensation circuit 204 may treat the measured initial phase difference as a zero phase difference such that, once a proper digital code is applied DCO 208 to lock the frequency, ADPLL circuit 200 achieves instant lock.

Advantageously, the zeroed out initial phase difference removes the necessity of having to build in a relatively large margin to ADPLL circuit 200, since output 203 of TDC 202 may be used to directly arrive at a desired lock condition. In addition, the output frequency of DCO 208 is controlled by reference clock 201, i.e., the loop frequency does not change, as any errors will be corrected by the loop itself. Further, even if, under certain operating conditions, instant lock cannot be accomplished within a desired time period, e.g., due to the presence of unwanted phase noise, noise caused by current injection at circuit nodes, or other variations, embodiments herein ensure that the locking time remains reasonably short.

Overall, instant locking using various embodiments presented herein may advantageously improve data throughput by reducing switching intervals between transmission and a receiving mode, thus, lowering power consumption. It is noted that, in embodiments, ADPLL circuit may be implemented in a dividerless architecture that, especially in high-frequency applications, ma be used to advantageously reduce power consumption, e.g., by eliminating delays otherwise caused by circuits comprising dividers.

Figure 3:
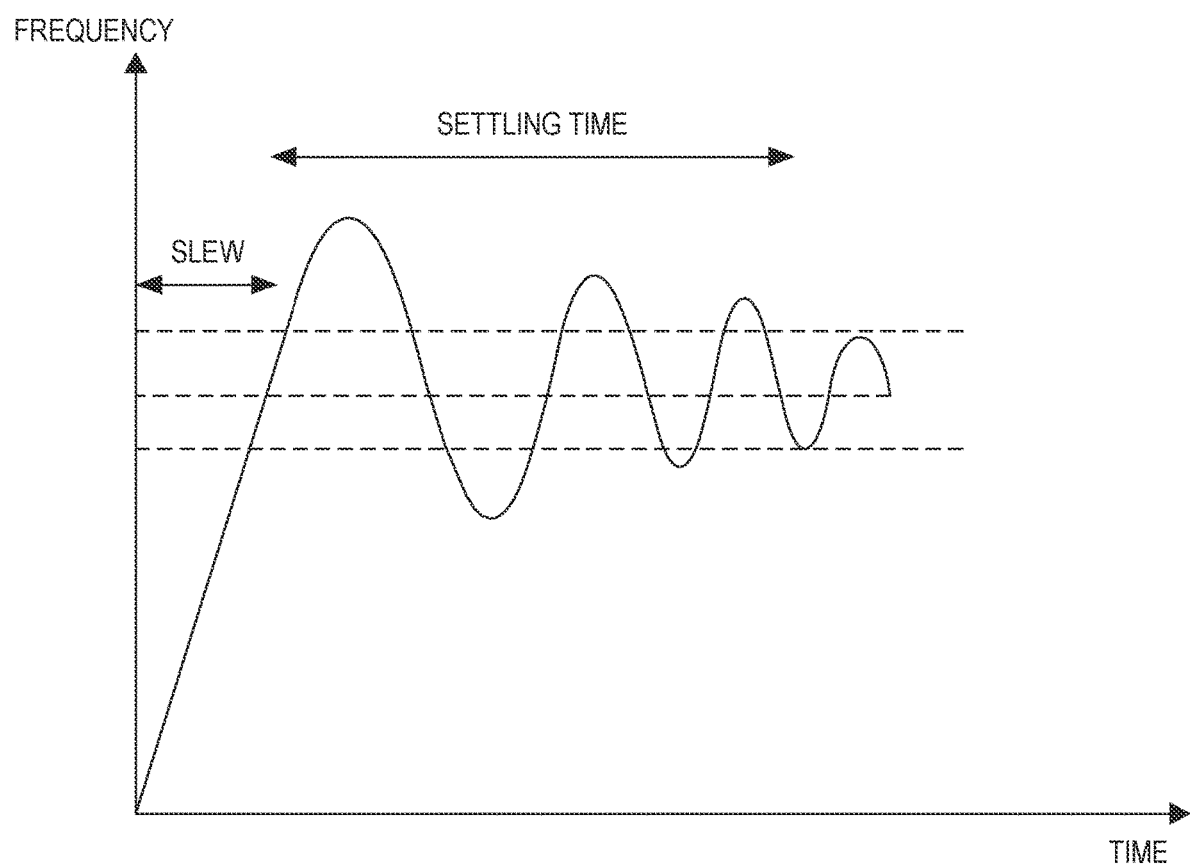
FIG. 3 is a plot illustrating an exemplary shortened settling time using a locking procedure according to various embodiments of the present disclosure.

FIG. 3 is a plot that illustrates an exemplary settling time using a locking procedure according to various embodiments of the present disclosure. As depicted, the PLL frequency settles after undergoing two distinct phases: a slew phase that is followed by a settling phase. Intuitively, setting a circuit's initial conditions at or close enough to the circuit's steady-state condition, advantageously, reduces the slew phase. As a result, unlike for existing circuits, a PLL circuit according to various embodiments has to correct, at the most, only a relatively small phase and/or frequency error prior to reaching the desired steady-state condition, which significantly reduces the locking time for ADPLL circuit 200.

Figure 4:
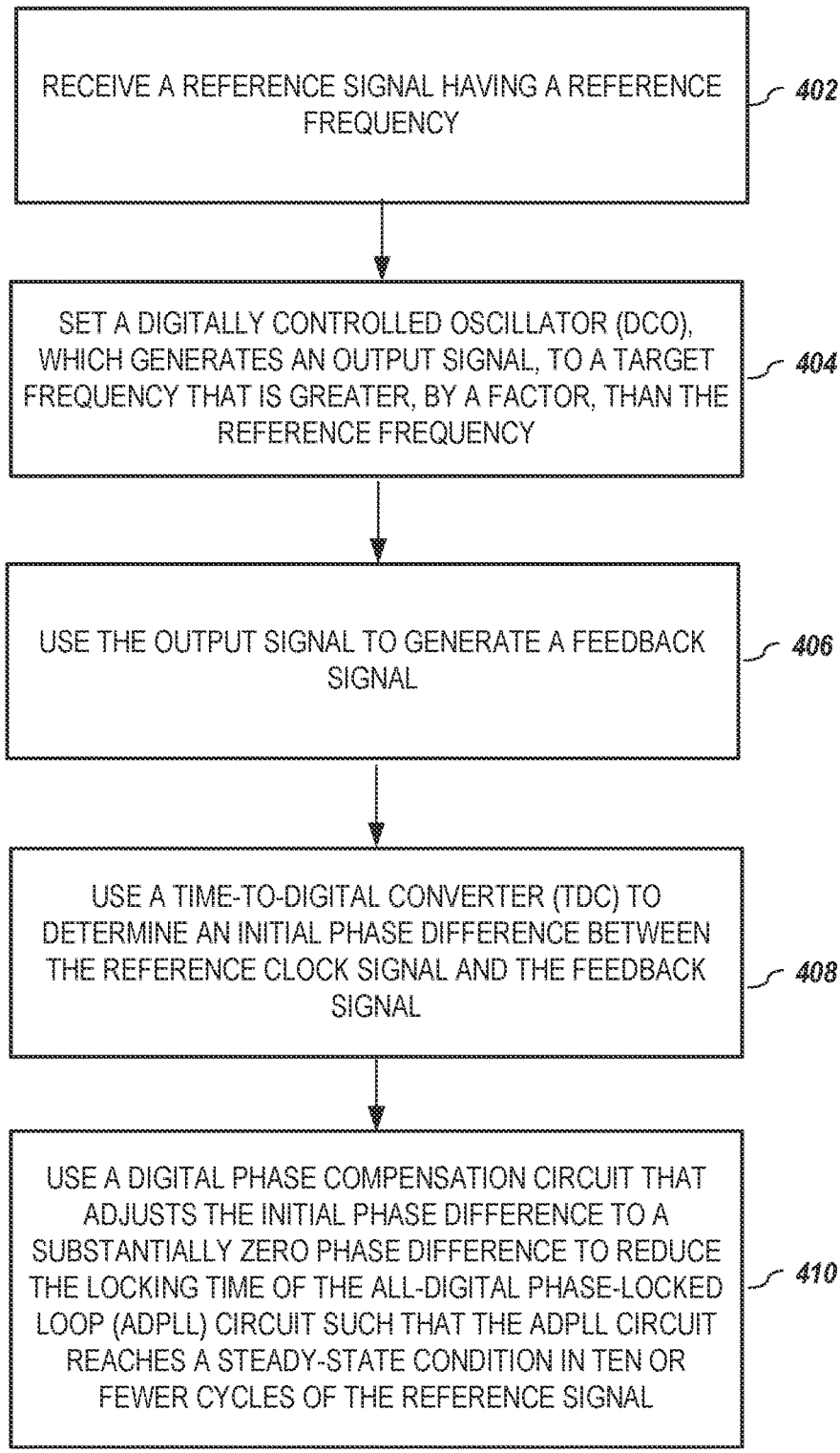
FIG. 4 is a flowchart of an illustrative process for reducing a locking time in a PLL circuit, according to various embodiments of the present disclosure.

FIG. 4 is a flowchart of an illustrative process for reducing a locking time of a type-II ADPLL circuit, according to various embodiments of the present disclosure. In embodiments, process 400 may begin, at step 402, when, at a TDC circuit, a reference signal that has a reference frequency is received, e.g., from a reference clock or a DTC circuit.

At step 404, a DCO, which may be implemented in the ADPLL circuit and that generates an output signal, may be set to a target frequency, e.g., a target frequency that is greater, by a factor, than the reference frequency.

At step 406, in response to receiving an output signal that is related to the DCO, the DCO may generate a feedback signal.

At step 408, the TDC circuit may be used to determine an initial phase difference between the reference clock signal and the output signal.

Finally, at step 410, a digital phase compensation circuit that adjusts the initial phase difference to a substantially zero phase difference to reduce the locking time of the ADPLL circuit may be used such that the ADPLL circuit reaches a steady-state condition in ten or fewer cycles of the reference signal.

One skilled in the art shall recognize that herein: (1) certain steps may optionally be performed; (2) steps may not be limited to the specific order set forth herein; (3) certain steps may be performed in different orders; and (4) certain steps may be done concurrently.

It is understood that a stop condition may include: (1) a set number of iterations have been performed; (2) an amount of processing time has been reached; (3) convergence (e.g., the difference between consecutive iterations is less than a threshold value); (4) divergence (e.g., the performance deteriorates); (5) an acceptable outcome has been reached; and (6) all of the data has been processed.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using application specific integrated circuits (ASICs), programmable arrays, digital signal processing circuitry, or the like. Accordingly, the terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks; optical media such as CD-ROMs and holographic devices; magneto-optical media; and hardware devices that are specially configured to store or to store and execute program code, such as ASICs, programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. An all-digital phase-locked loop (ADPLL) circuit comprising:
   a time-to-digital converter (TDC) comprising a first input and a second input, the TDC generates a quantized output that represents a phase difference between the first input and the second input;
   a digital phase compensation circuit that performs steps comprising generating an adjusted quantized output representative of a substantially zero phase difference between the first input and the second input;
   a digitally controlled oscillator (DCO) that, in response to receiving the adjusted quantized output and a target frequency, generates a DCO output signal, the DCO obtains the target frequency from a calibration made using an open loop circuit configuration; and
   a feedback path that uses a feedback signal to couple the DCO output signal to the second input.

2. The ADPLL according to claim 1, further comprising a frequency divider coupled to the second input, the frequency divider subsamples the DCO output signal to generate a first clock signal that has a first clock frequency that is lower than a reference frequency of a reference signal.

3. The ADPLL according to claim 2, wherein the frequency divider subsamples the DCO output signal in response to receiving a rising edge of the DCO output signal that operates at the target frequency and a rising edge of the reference signal that comprises the reference frequency.

4. The ADPLL according to claim 2, further comprising a digital-to-time converter (DTC) that, in response to receiving a second clock signal comprising a second clock frequency, generates the reference signal.

5. The APLL according to claim 1, wherein the feedback path comprises a frequency divider that, in response to receiving the DCO output signal, generates the feedback signal.

6. The APLL according to claim 1, wherein the calibration is performed in a power-up phase.

7. The APLL according to claim 1, wherein the calibration uses a control signal to generate a digital code that causes the DCO to operate at the target frequency.

8. The APLL according to claim 7, wherein the control signal is generated by a loop filter circuit coupled to digital phase compensation circuit.

9. The ADPLL according to claim 8, wherein the loop filter circuit attenuates at least one of a high-frequency noise or a phase noise in the adjusted quantized output.

10. A method for reducing a locking time of a type-II all-digital phase-locked loop (ADPLL) circuit, the method comprising:
    receiving a reference signal having a reference frequency;
    setting a digitally controlled oscillator (DCO) to a target frequency that is greater, by a factor, than the reference frequency, the DCO generating an output signal, the target frequency is obtained from a calibration made using an open loop circuit configuration;
    using the output signal to generate a feedback signal;
    using a time-to-digital converter (TDC) to determine an initial phase difference between the reference signal and the feedback signal; and
    using a digital initial phase compensation circuit that adjusts the initial phase difference to a substantially zero phase difference to reduce the locking time of the ADPLL circuit such that the ADPLL circuit reaches a steady-state condition in ten or fewer cycles of the reference signal.

11. The method according to claim 10, wherein the initial phase difference is defined by a time difference between a rising edge of the feedback signal that is closest to a rising edge of the reference signal.

12. The method according to claim 10, wherein the calibration is performed in a power-up phase of the APLL.

13. The method according to claim 10, wherein the calibration generates a digital code that causes the DCO to operate at the target frequency.

14. The method according to claim 13, wherein the calibration uses a control signal to generate the digital code.

15. The method according to claim 14, wherein the control signal is generated by a loop filter circuit coupled to digital phase compensation circuit.

16. The method according to claim 15, wherein the loop filter circuit attenuates at least one of a high-frequency noise or a phase noise.

17. The method according to claim 10, wherein the DCO output signal is divided by a frequency divider located in a feedback path.

18. The method according to claim 17, wherein the frequency divider generates the feedback signal in response to receiving the DCO output signal.

* * * * *